United States Patent
Furukawa et al.

(10) Patent No.: US 6,620,675 B2
(45) Date of Patent: Sep. 16, 2003

(54) INCREASED CAPACITANCE TRENCH CAPACITOR

(75) Inventors: Toshiharu Furukawa, Essex Junction, VT (US); Mark C. Hakey, Fairfax, VT (US); Steven J. Holmes, Milton, VT (US); William H. Ma, Fishkill, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/682,607

(22) Filed: Sep. 26, 2001

(65) Prior Publication Data

US 2003/0060005 A1 Mar. 27, 2003

(51) Int. Cl.$^7$ .......................................... H01L 21/8242
(52) U.S. Cl. .................. 438/243; 438/248; 438/255; 438/386; 438/391; 438/398; 438/964
(58) Field of Search ................... 257/301, 303, 257/309; 438/243, 244, 245, 255, 386, 387, 388, 398, 248, 391, 947, 964

(56) References Cited

U.S. PATENT DOCUMENTS

| | | | |
|---|---|---|---|
| 4,906,590 A | * 3/1990 | Kanetaki et al. | 438/386 |
| 5,102,832 A | 4/1992 | Tuttle | 438/398 |
| 5,155,657 A | 10/1992 | Oehrlein et al. | 361/313 |
| 5,158,905 A | * 10/1992 | Ahn | 438/396 |
| 5,227,322 A | * 7/1993 | Ko et al. | 438/387 |
| 5,254,503 A | 10/1993 | Kenney | 438/702 |
| 5,466,626 A | 11/1995 | Armacost et al. | 438/700 |
| 5,474,950 A | * 12/1995 | Kim | 438/396 |
| 5,616,511 A | * 4/1997 | Hirota | 438/396 |
| 5,760,434 A | 6/1998 | Zahurak et al. | 257/309 |
| 5,766,968 A | 6/1998 | Armacost et al. | 438/398 |
| 5,959,326 A | 9/1999 | Aiso et al. | 257/306 |
| 5,981,350 A | * 11/1999 | Geusic et al. | 438/396 |
| 6,015,983 A | 1/2000 | Parekh | 257/296 |
| 6,020,609 A | 2/2000 | Wu | 257/309 |
| 6,060,355 A | 5/2000 | Batra et al. | 438/255 |
| 6,140,177 A | 10/2000 | Schafer et al. | 438/253 |
| 6,150,217 A | * 11/2000 | Chang et al. | 438/255 |
| 6,204,141 B1 | * 3/2001 | Lou | 438/386 |
| 6,448,131 B1 | * 9/2002 | Cabral, Jr. et al. | 438/243 |
| 6,495,411 B1 | * 12/2002 | Mei | 438/239 |

FOREIGN PATENT DOCUMENTS

| | | | |
|---|---|---|---|
| JP | 63239937 | 10/1988 | H01L/21/205 |

OTHER PUBLICATIONS

Selective Dry Etching of Silicon with Respect to Germanium, Oehrlein et al., Appl. Phys. Lett. 56 (15), Apr. 9, 1990, pp. 1436–1438.

Reactive Ion Etching Processes for Amorphous Germanium Alloys, Yue Kuo, Mat. Res. Soc. Symp. Proc. (1994), vol. 316, pp. 1041–1046.

Comparison of Etching Processes of Silicon and Germanium in $SF_6$–$O_2$ Radio–Frequencey Plasma, Campo et al., J. Vac. Sci. Technol. B 13(2), Mar./Apr. 1995, pp. 235–241.

(List continued on next page.)

*Primary Examiner*—Amir Zarabian
*Assistant Examiner*—Toniae M. Thomas
(74) *Attorney, Agent, or Firm*—Schmeiser, Olsen & Watts; Mark F. Chadurjian (57) ABSTRACT

Disclosed is a method of increasing the capacitance of a trench capacitor by increasing sidewall area, comprising: forming a trench in a silicon substrate, the trench having a sidewall; forming islands on the sidewall of the trench; and etching pits into the sidewall using the islands as a mask. The capacitor is completed by forming a node insulator on the pits and the sidewall; and filling said trench with a trench conductor.

24 Claims, 7 Drawing Sheets

OTHER PUBLICATIONS

Fabrication of Multiperiod Si/SiO$_2$/Ge Layered Structure Through Chemical Bond Manipulation, Prabhakaran et al., 1998 American Institute of Physics, pp. 3169–3171.

Visible Photoluminescence From Ge Nanocrystal Embedded Into A SiO$_2$ Matrix Fabricated By Atmospheric Pressure Chemical Vapor Deposition, Achyut Kumar Dutta, Appl. Phys. Lett. 68(9), Feb. 26, 1996, pp. 1189–1191.

Low Pressure Chemical Vapor Deposition of Si$_{1-x}$Ge$_x$ Films on SiO$_2$, Cao et al., J. Electrochem. Soc., vol. 142, No. 5, May 1995, pp. 1566–1572.

Nanocrystalline Ge Synthesis by the Chemical Reduction of Hydrothermally Grown Si$_{0.6}$Ge$_{0.4}$O$_2$, Paine et al., Journal of Electronic Materials, vol. 23, No. 9, 1994, pp. 901–906.

Nanocrystalline Ge in SiO$_2$ By Annealing of Ge$_x$Si$_{1-x}$O$_2$ In Hydrogen, Liu et al., Appl. Phys. Lett. 62 (25), Jun. 21, 1993, pp. 3321–3323.

* cited by examiner

INCREASED CAPACITANCE TRENCH CAPACITOR

DETAILED DESCRIPTION OF THE INVENTION

1. Field of the Invention

The present invention relates to the field of trench capacitors for integrated circuits; more specifically, it relates to trench capacitors having an increased plate area and methods of fabricating said trench capacitors.

2. Background of the Invention

Dynamic random access memories (DRAM) are widely used in computer technology. Typically, the DRAM cells are used to store data in the form of bits. DRAMs store bits as charge (or the absence of charge) on a capacitor. Since the charge can leak off, DRAMs must be periodically refreshed. Refreshing consumes power and time. Additionally, as DRAM performance has increased cell size, and horizontal capacitor size has decreased. Decreasing the size of the capacitor results in less charge being stored, making the cell more difficult to read as well as more sensitive to leakage.

One type of capacitor used for DRAMs is a trench capacitor. A trench capacitor is formed by forming a trench in a silicon substrate, lining the sidewalls of the trench with a dielectric and filling the trench with a conductive material. The substrate acts as one plate of the capacitor and the conductive fill as the second plate. The capacitance of a trench capacitor is a function of the dielectric thickness and the surface area of the trench sidewalls and bottom, which define the plate area as given by $C=\hat{I}\mu A/d$, where C is the capacitance, $\hat{I}\mu$ is the dielectric constant of the dielectric layer, d is the thickness of the dielectric layer and A is the surface area of the plates.

Capacitance of a trench capacitor may be increased in several ways. First, the dielectric layer may be made thinner, but leakage becomes a concern. Second, the dielectric may be selected to have a high dielectric constant, but such exotic materials are hard to control and incorporate into DRAM technology. Third, the area of the plates may be increased. Since the area of the plates has been decreasing by reducing horizontal dimension of the trench capacitor, increasing the vertical depth of the trench capacitor has indeed been done. However, there are technology limits as to how deep a trench can be etched in silicon before vertical etch depth does not increase significantly with increased etch time and blow out of horizontal dimensions occurs. Further very deep trenches are difficult to fill.

SUMMARY OF THE INVENTION

A first aspect of the present invention is a method of increasing the capacitance of a trench capacitor by increasing sidewall area, comprising: forming a trench in a silicon substrate, the trench having a sidewall; forming islands on the sidewall of the trench; and etching pits into the sidewall using the islands as a mask.

A second aspect of the present invention is a method of fabricating a trench capacitor, comprising: forming a trench in a silicon substrate, the trench having a sidewall; forming islands on the sidewall of the trench; etching pits into the sidewall using the islands as a mask; forming a node insulator on the pits and the sidewall; and filling the trench with a trench conductor.

A third aspect of the present invention is a trench capacitor, comprising: a trench in a silicon substrate, the trench having a sidewall; pits etched into the sidewall; a node insulator on the pits and the sidewall; and a trench conductor filling the trench.

A fourth aspect of the present invention is a dynamic random access memory cell, comprising: a FET comprising: a first and second source/drain region formed in a silicon substrate; a channel region between the first and second source/drain regions; a gate dielectric formed over the channel region; a wordline formed over the gate dielectric; and a bitline electrically connected to the first source/drain; a trench capacitor comprising: a trench in the silicon substrate, the trench having a sidewall; pits etched into the sidewall; a node insulator on the pits and the sidewall; and a trench conductor filling the trench.; and the second source/drain electrically connected to the trench conductor.

BRIEF DESCRIPTION OF DRAWINGS

The features of the invention are set forth in the appended claims. The invention itself, however, will be best understood by reference to the following detailed description of an illustrative embodiment when read in conjunction with the accompanying drawings, wherein:

DETAILED DESCRIPTION OF THE INVENTION

Figure 1:
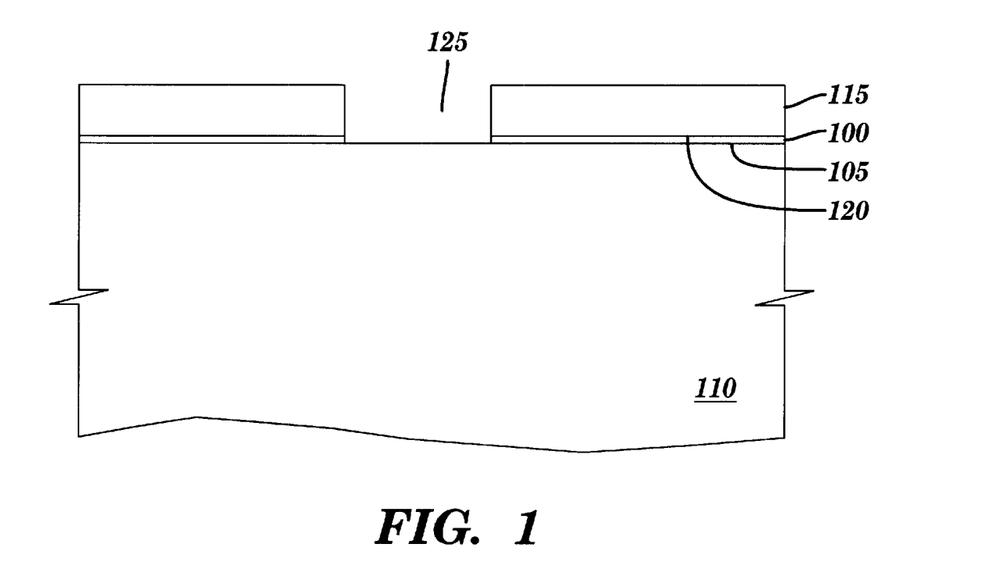
FIGS. 1 through 10 are cross-sectional views illustrating fabrication of a trench capacitor according to a first embodiment of the present invention.

FIGS. 1 through 10 are cross-sectional views illustrating fabrication of a french capacitor according to a first embodiment of the present invention. In FIG. 1, a pad oxide layer 100 is formed on a top surface 105 of a silicon substrate 100. A mask layer 115 is formed on a top surface 120 of pad oxide layer 100. A trench 125 is formed in pad oxide layer 100 and mask layer 115 exposing top surface 105 of silicon substrate 110 at the bottom of the trench. In one example, pad oxide layer 100 is silicon oxide formed by a thermal oxidation process and is about 100 Å thick and mask layer 115 is a dual layer of about 5,000 Å to 10,000 Å of silicon oxide formed over about 1200 Å of silicon nitride, both the silicon oxide and silicon nitride formed by chemical vapor deposition (CVD) processes. Pad oxide layer 100 serves to protect top surface 105 of silicon substrate 110 from contamination while mask layer 115 is a hard mask for etching silicon substrate 110.

Figure 2:
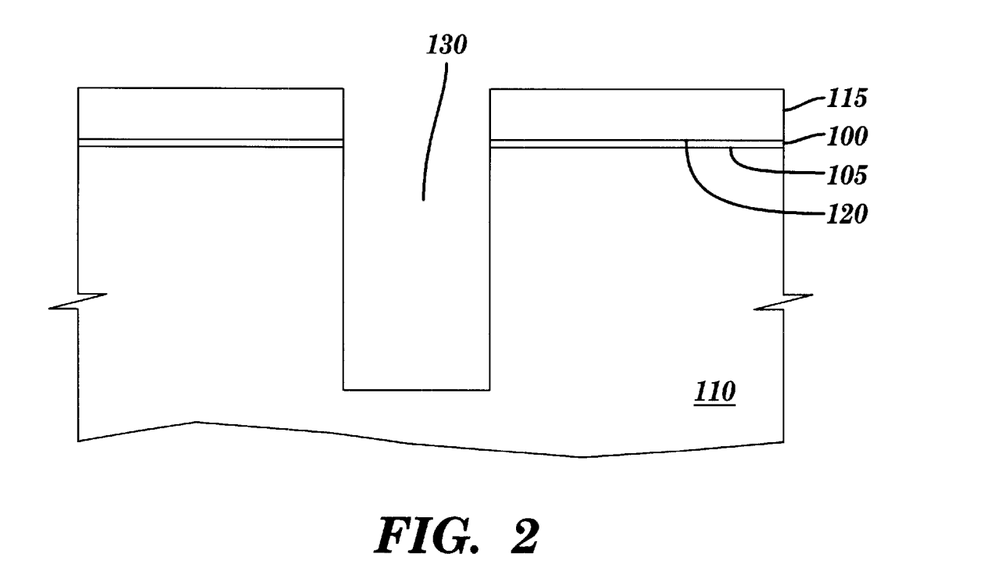

In FIG. 2, a trench 130 is etched in silicon substrate 110. In one example, trench 130 is about 6 to 12 microns deep and is etched by a reactive ion etch (RIE) process using an HBR/O2 gas mixture.

Figure 3:
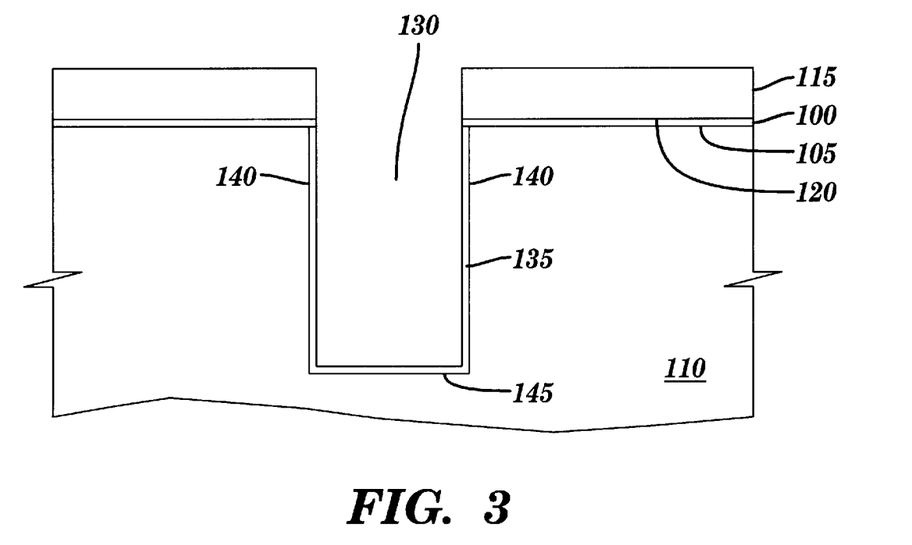

In FIG. 3, a thin mask layer 135 is formed on sidewalls 140 and bottom 145 of trench 130. In one example, thin mask layer 135 is about 10 to 100 Å . . . of silicon oxide formed by a thermal oxidation process.

Figure 4:
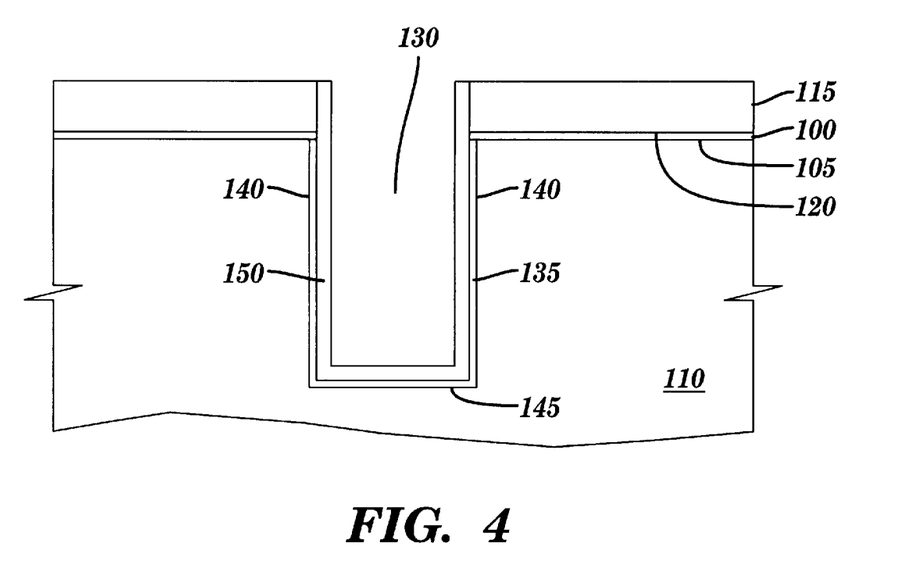
Figure 5:
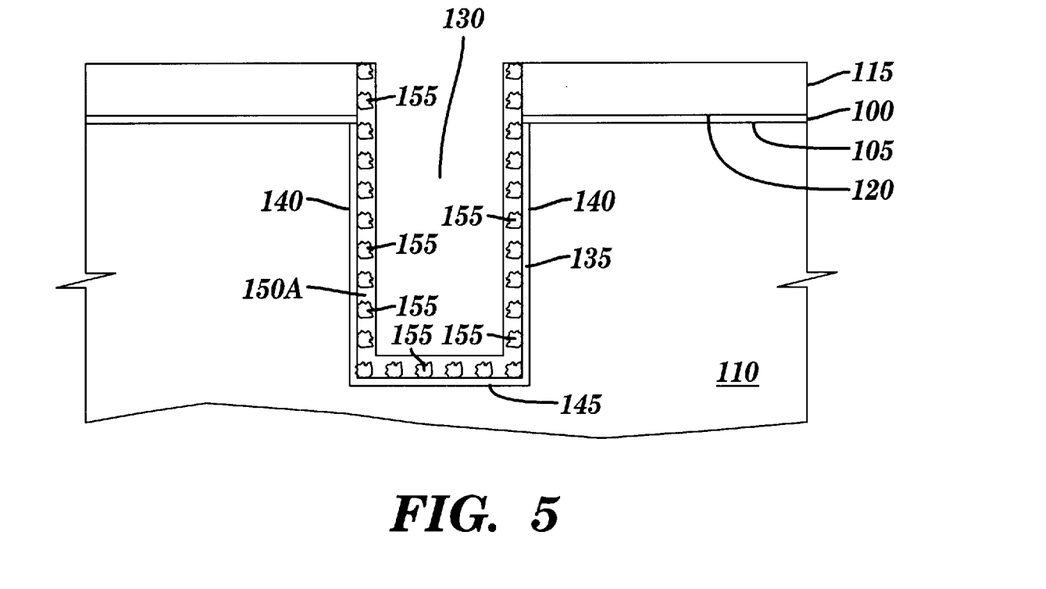

FIGS. 4 and 5 illustrate the process of forming a conglomerate layer, having particulates embedded in a matrix, on top of thin mask layer 135. In FIG. 4, a precursor layer 150 is formed over thin mask 135. In FIG. 4, a precursor layer 150 is formed over thin mask 135. In FIG. 5, precursor layer 150 is converted to a conglomerate layer 150A. In one example, conglomerate layer 150A comprises Ge nanocrystalls (nc-Ge) 155 in a $SiO_2$ matrix. Several methods exist for forming precursor layer 150 and for converting the precursor layer to conglomerate layer 150A.

In a first method, precursor layer 150 comprises a layer of $Si_{1-x}Ge_x$ (in one example, x=0.58 to 0.85) formed by low-pressure chemical vapor deposition (LPCVD) using $SiH_4$ and $GeH_4$ gases at about 600 to 800° C. Precursor layer 150 is about 10 to 100 Å . . . thick. The $Si_{1-x}Ge_x$ is converted to $Si_{1-x}Ge_xO_2$ (in one example, x=0.58 to 0.85) by a high-pressure oxidation (about 25 MPa) using $H_2O$ at about 475° C. Then, the $Si_{1-x}Ge_xO_2$ is converted to nc-Ge in a $SiO_2$ layer 150A by low-pressure (about 0.1 MPa) rapid thermal anneal (RTA) in $H_2$ or 20% $H_2$ in $N_2$ for about 1 to 120 minutes. The nanocrystalls of Ge are about 10 to 100 Å . . . in size.

In the second method, precursor layer 150 comprises a layer of germosillicate glass (GSG-$GeO_x$ mixed with $SiO_x$) fonned by atmospheric pressure chemical vapor deposition (APCVD) using tetraethyloxysilane (TEOS—$Si(OC_2H_5)_4$), timethylgerminate (TMG-$Ge(OCH_3)_3$) and $O_3$ at about 415° C. Precursor layer 150 is about 10 to 100 Å thick. The GSG is then converted to nc-Ge in $SiO_2$ layer 150 Å by annealing in hydrogen for about 60 to 120 minutes at about 700 to 800° C. The nanocrystalls of Ge are about 10 to 100 Å in size.

Figure 6:
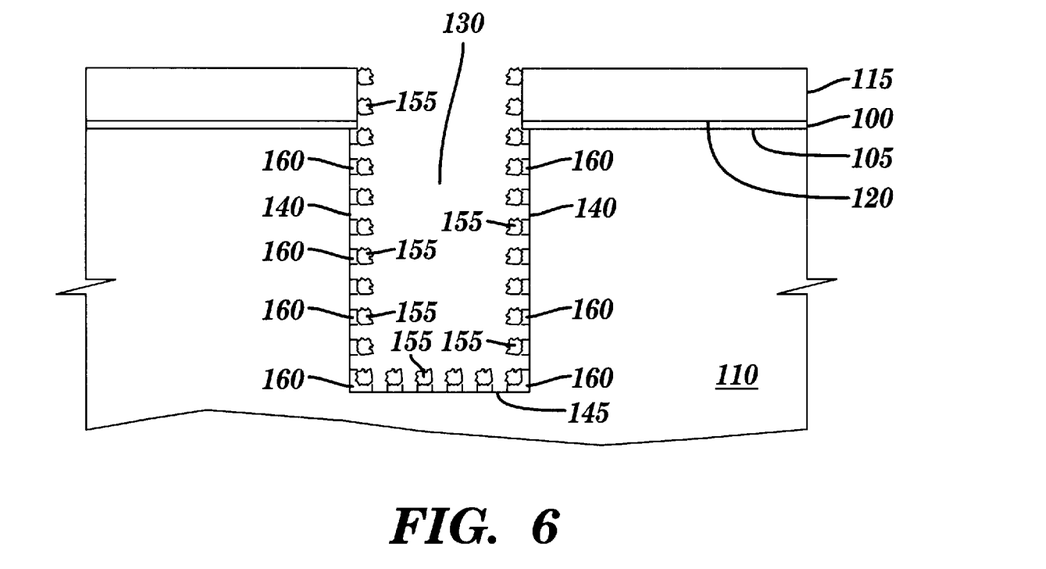

In FIG. 6, most of the $SiO_2$ matrix of Ge in $SiO_2$ layer 150 Å as well as portions of thin mask layer 135 is etched away leaving nc-Ge crystals 155 over islands 160 wherever the nc-Ge crystals protect the thin mask layer from the etch process to expose silicon substrate 110 on sidewalls 140 and bottom 145 of trench 130 between the islands. Some of the $SiO_2$ matrix between nc-Ge crystals 155 and thin mask layer 135 remains, being protected by the nc-Ge crystals. A 200 or more:1 dilute aqueous dilute HF may be used for etching exposed portions of thin mask layer 135 to form islands 160. An RIE etch may be used, but it would need to etch $SiO_2$ selective to Ge.

Figure 7:
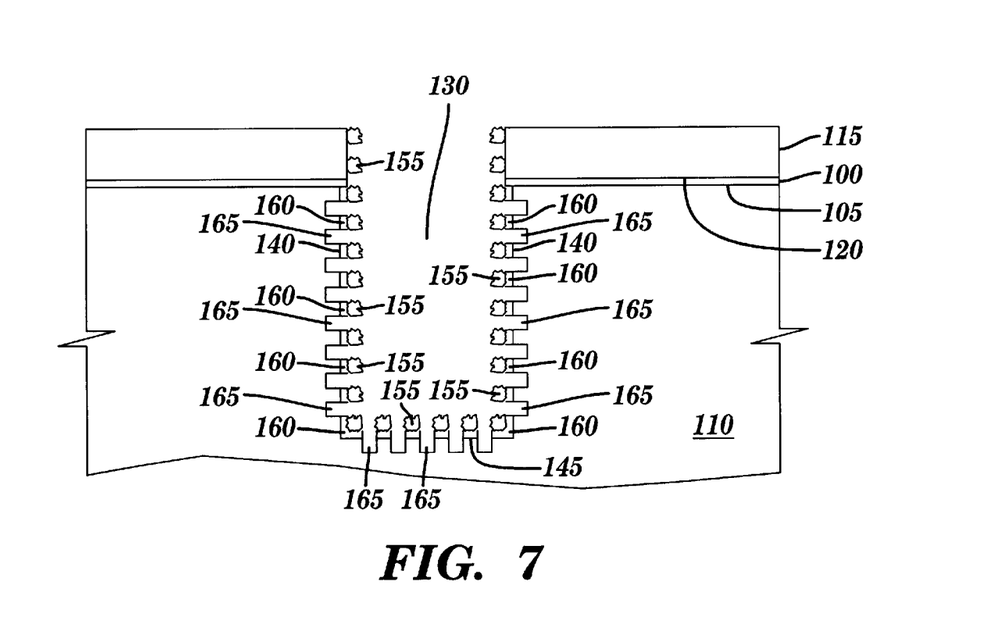

In FIG. 7, pits 165 are formed in silicon substrate 110 wherever silicon substrate 110 is exposed between islands 160. Pits 165 may be formed by one of two processes. In the first process, a Si selective to Ge and $SiO_2$ plasma etch process is used to form pits 165. Examples of a Si selective to Ge and $SiO_2$ plasma etch process include a $SF_6/O_2$ chemistry where $O_2$ is less than 50% of the total gas volume and a $SF_6$ (35 sccm)/H2 (65 sccm)/$CF_4$ (80 sccm) chemistry at 75 watts or lower RF power. In a second process, a Si selective to $SiO_2$ but not selective to Ge is used to form pits 165. An example of a Si selective to $SiO_2$ but not selective to Ge is a $SF_6/O_2$ chemistry where $O_2$ is greater than 50% of the total gas volume. Using the second process, nc-Ge crystals 155 are partially or totally etched away as pits 165 are formed.

Figure 8:
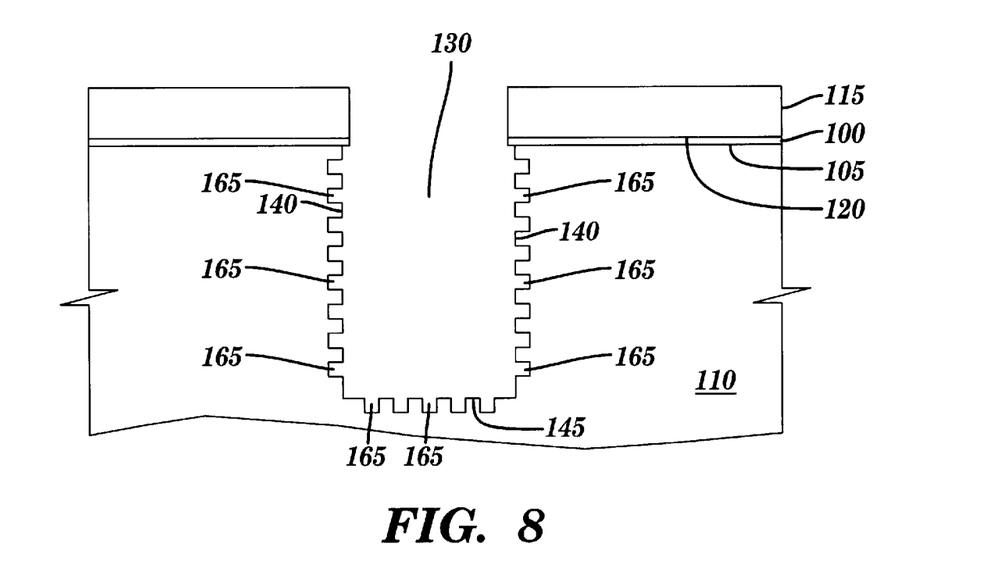

In FIG. 8, nc-Ge crystals 155 and islands 160 are etched away. If nc-Ge crystals 155 were not etched away during formation of pits 165 the nc-Ge crystals are etched away now using one of the Si/Ge etch plasma chemistries indicated above. Islands 160 are etched away by using about 100:1 to 200 to 1 aqueous dilute HF.

Figure 9:
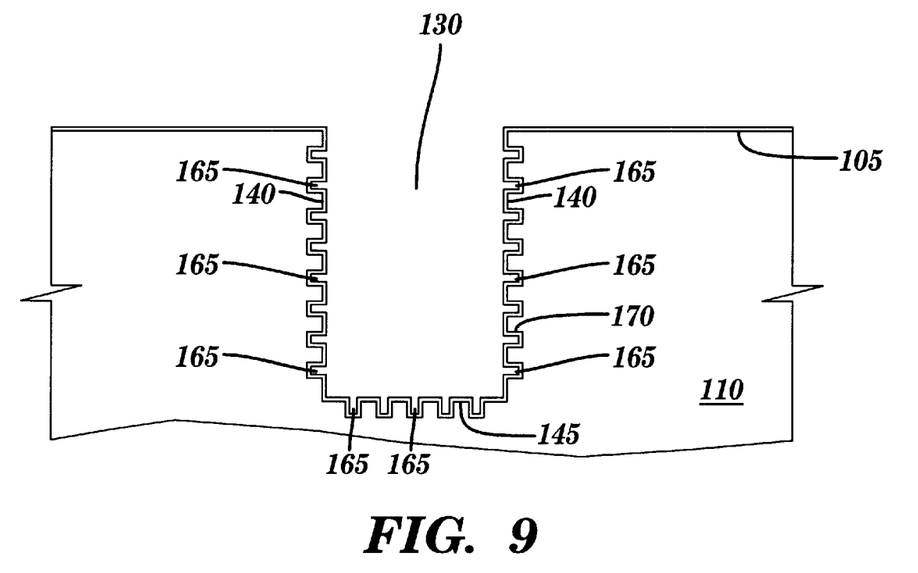

In FIG. 9, pad oxide layer 100 and any remaining mask layer 115 are removed, and a conformal node insulator layer 170 is formed on all exposed silicon surfaces in trench 130. Optionally, as a surface preclean before node insulator formation, about 10 to 20 Å of sacrificial oxide may be formed on sidewalls 140 and bottom 145 of trench 130 as well as on all surfaces of pits 165, and then removed using about 100:1 to 200:1 aqueous dilute HF. Node insulator layer 170 is formed over all surfaces of pits 165, and over remaining portions of sidewalls 140 and bottom 145 of trench 130. Node insulator layer 170 is continous in trench 130. In one example, node insulator layer 170 is comprised of a dual layer of about 50 Å or less of silicon nitride over about 50 Å or less of silicon oxide. In a second example, node insulator layer 170 is comprised of about 50 Å or less of silicon oxide. In a third example, node insulator layer 170 is comprised of about 50 Å or less of silicon oxynitride.

Figure 10:
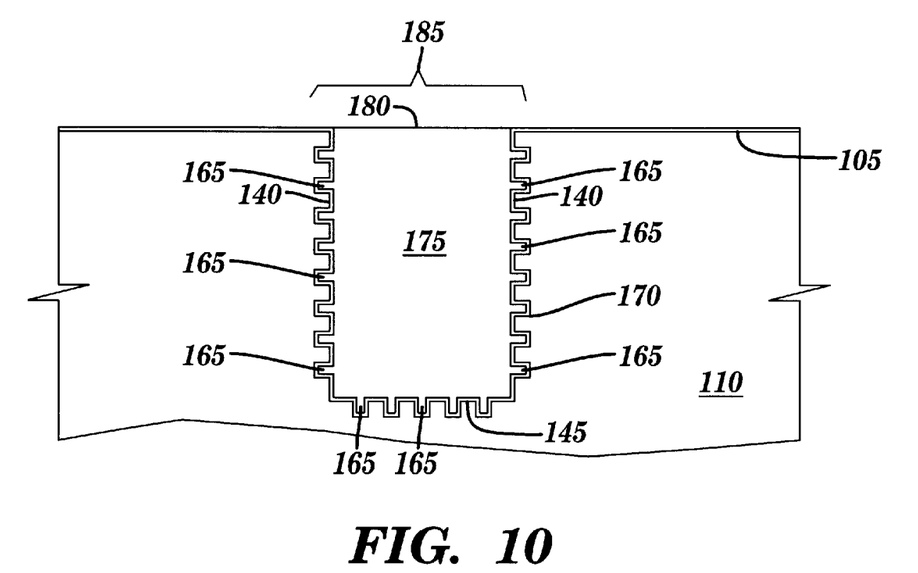

In FIG. 10, french 130 is filled with a trench conductor 175. Trench conductor 175 may be formed by a CVD process followed by a chemical mechanical polish (CMP) step to make a top surface 180 of the trench conductor co-planer with top surface 105 of silicon substrate 110. In one example, trench conductor 175 is comprised of tungsten or polysiicon (N or P doped or undoped), tungsten nitride, titanium nitride or other refractory metal or metal compound. A trench capacitor 185 has thereby been formed. Trench conductor 175 forms a first plate, silicon substrate 110 forms a second plate and node insulator 170 forms the dielectric of trench capacitor 185. Since the storage capacity of a capacitor is directly related to the surface area of the plates trench capacitor 185 has increased capacitance over a trench capacitor having smooth sidewalls because of the increased surface area due to etch pits 165.

Figure 11:
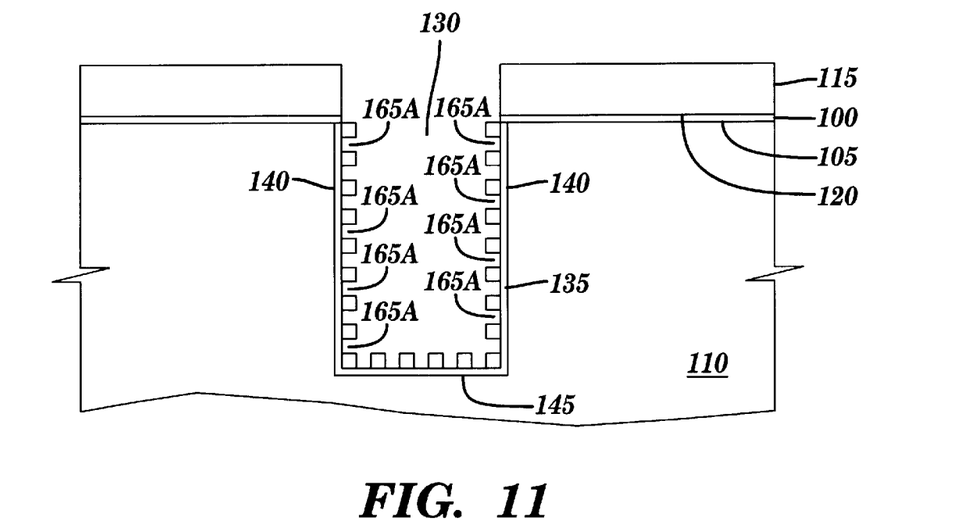
FIGS. 11 and 12 are cross-sectional views illustrating fabrication of a trench capacitor according to a second embodiment of the present invention.
Figure 12:
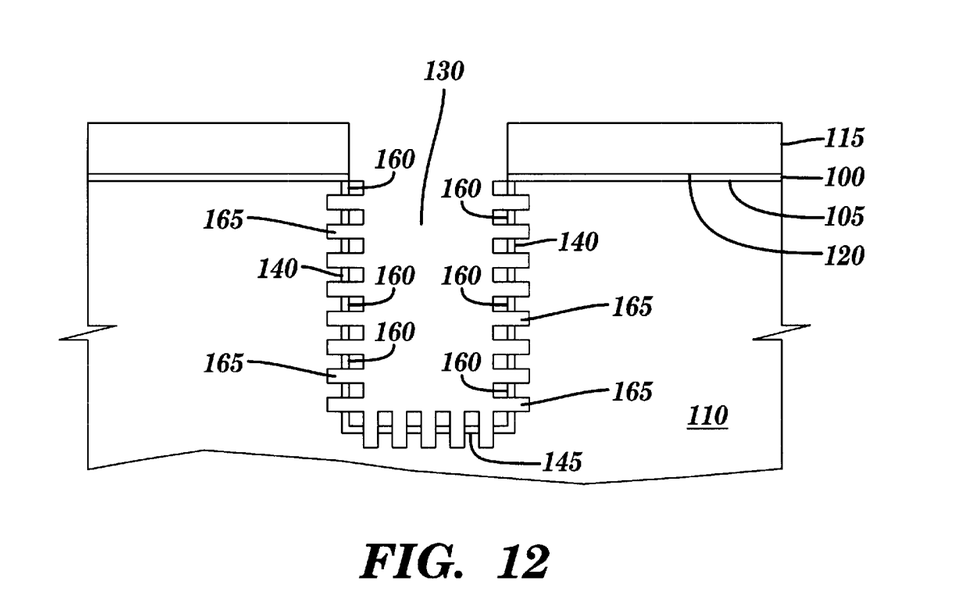

FIGS. 11 and 12 are cross-sectional views illustrating fabrication of a french capacitor according to a second embodiment of the present Invention. FIG. 11 corresponds to FIG. 6 and FIG. 12 corresponds to FIG. 7 of the first embodiment. The steps illustrated in FIGS. 1 through 5 and 8 through 10 and described above apply to the second embodiment as well.

In FIG. 11, nc-Ge crystals 155 are removed from conglomerate layer 150, instead of $SiO_2$ matrix using a C12 plasma etch process leaving pits 165A in layer 150A.

In FIG. 12, pits 165 are formed in silicon substrate 110 by first etching through thin mask layer 135 and then etching silicon substrate 110 as described above.

Figure 13:
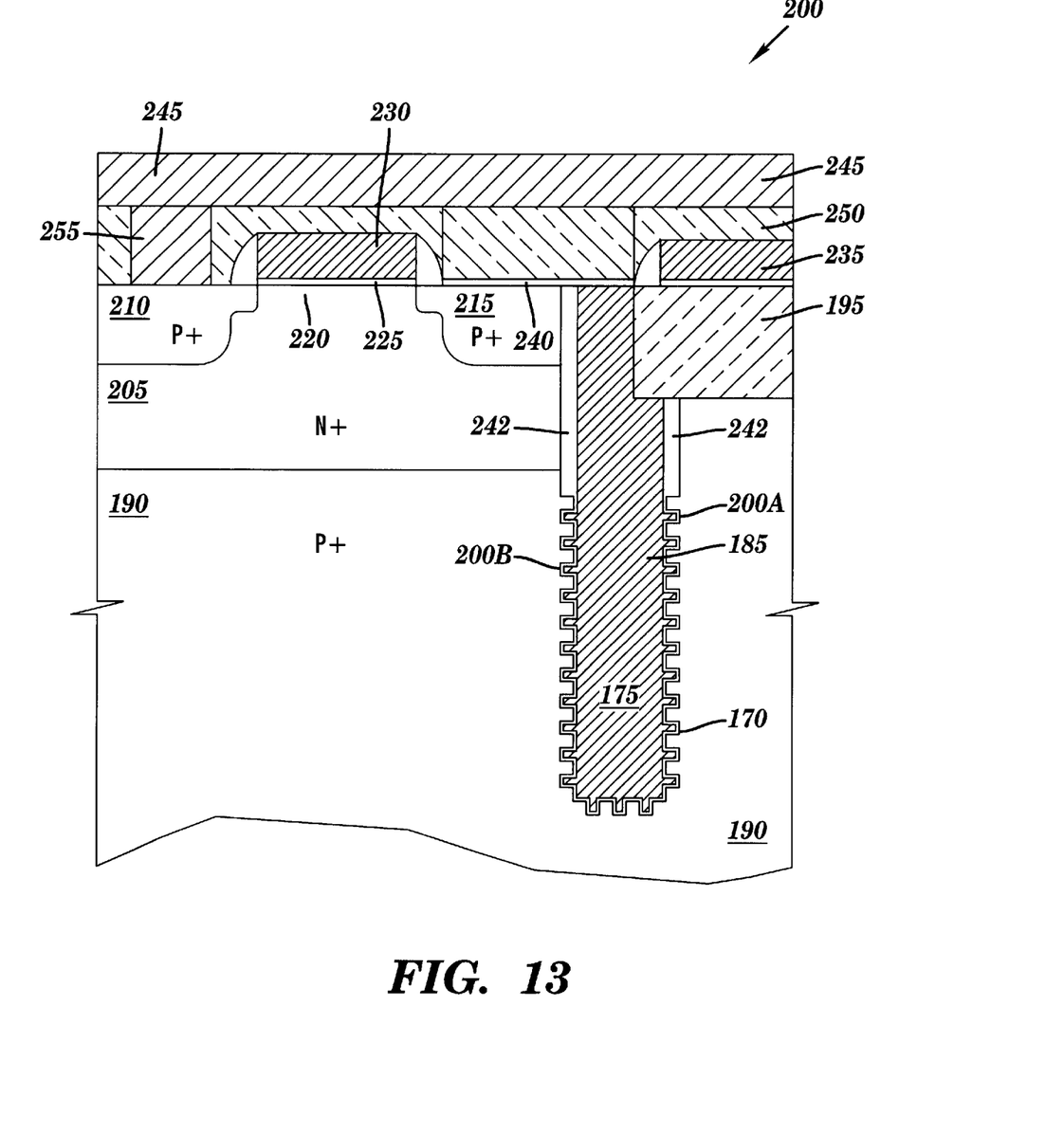
FIG. 13 is a partial cross sectional view of a dynamic random access memory (DRAM) cell utilizing the trench capacitor of the present invention as a charge storage device.

FIG. 13 is a partial cross sectional view of a DRAM cell utilizing the trench capacitor of the present invention as a charge storage device. In FIG. 13, DRAM cell 200 comprises trench capacitor 185 formed in a P+ silicon substrate 190. Also formed in silicon substrate 190 is a shallow trench isolation (STI) 195 abutting a first side 200A of trench capacitor 185 and an N-well 205 abutting a second side 200B of the trench capacitor. Formed in N-well 205 are a first P+ source/drain 210 and a second P+ source/drain 215 separated by a channel region 220. Second source drain 215 abuts second side 200B of trench capacitor 185. Formed over channel region 220 is a gate dielectric 225 and formed over gate dielectric 225 is a wordline 230 (which also acts a pass-gate.) Formed over STI 195 is a passing wordline 235. A conductive strap 240 electrically connects second source drain 215 to trench conductor 175. Trench capacitor 185 includes an insulating collar 242 extending from strap 240 past N-well 205 into substrate 190. A bitline 245 is formed over an insulating layer 250. Bitline 245 is electrically connected to first source/drain 210 by a bitline contact 255. The operation of DRAM cell 200 is well known to those skilled in the art.

The description of the embodiments of the present invention is given above for the understanding of the present invention. It will be understood that the invention is not limited to the particular embodiments described herein, but is capable of various modifications, rearrangements and substitutions as will now become apparent to those skilled in the art without departing from the scope of the invention. Therefore it is intended that the following claims cover all such modifications and changes as fall within the true spirit and scope of the invention.

What is claimed is:

1. A method of increasing the capacitance of a trench capacitor by increasing sidewall area, comprising:

forming a trench in a silicon substrate, said trench having a sidewall;

forming islands on said sidewall of said trench;

etching pits into said sidewall using said islands as a mask;

wherein forming islands on said sidewalls of said trench comprises forming a mask layer on said sidewall of said trench;

forming a precursor layer on said mask layer;

converting said precursor layer to a conglomerate layer comprised of particulates in a matrix;

removing said matrix from between said particulates to expose portions of said mask layer; and removing portions of exposed mask layer to form said islands.

2. The method of claim 1, wherein said mask layer is a thin silicon oxide.

3. The method of claim 1, wherein said particulates are crystalline.

4. The method of claim 1, wherein said precursor layer is selected from the group consisting of $Si_{1-x}Ge_x$ and germosilicate glass.

5. The method of claim 1, wherein said conglomerate layer comprises Ge nanocrystalls in a silicon oxide matrix.

6. The method of claim 1, wherein:

said precursor layer comprises $Si_{1-x}Ge_x$ formed by low-pressure chemical vapor deposition;

said conglomerate layer comprises Ge nanocrystalls in a silicon oxide matrix; and said precursor layer is converted to said conglomerate layer by a high-pressure oxidation followed by a reduction in hydrogen.

7. The method of claim 1, wherein:

said precursor layer comprises germosilicate glass formed by atmospheric pressure chemical vapor deposition;

said conglomerate layer comprises Ge nanocrystalls in a silicon oxide matrix; and said precursor layer is converted to said conglomerate layer by annealing in hydrogen.

8. The method of claim 1, wherein said precursor layer is between 10 and 100 Å . . . thick.

9. The method of claim 1, wherein said particulates are removed simultaneously with the etching of said pits.

10. The method of claim 1, wherein said particulates are between 10 and 100 Å . . . in size.

11. The method of claim 5, wherein said Ge nanocrystalls are between 10 and 100 Å . . . in size.

12. A method of fabricating a trench capacitor, comprising:

forming a trench in a silicon substrate, said trench having a sidewall;

forming islands on said sidewall of said trench;

etching pits into said sidewall using said islands as a mask;

forming a node insulator on said pits and said sidewall; and filling said trench with a trench conductor;

wherein forming islands on said sidewalls of said trenches comprising:

forming a mask layer on said sidewall of said trench;

forming a precursor layer on said mask layer;

converting said precursor layer to a conglomerate layer comprised of particulates in a matrix;

removing said matrix from between said particulates to expose portions of said mask layer; and removing portions of exposed mask layer to form said islands.

13. The method of claim 12, wherein said mask layer is a thin silicon oxide.

14. The method of claim 12, wherein said particulates are crystalline.

15. The method of claim 12, wherein said precursor layer is selected from the group consisting of $Si_{1-x}Ge_x$ and germosilicate glass.

16. The method of claim 12, wherein said conglomerate layer comprises Ge nanocrystalls in a silicon oxide matrix.

17. The method of claim 12, wherein:

said precursor layer comprises $Si_{1-x}Ge_x$ formed by low-pressure chemical vapor deposition;

said conglomerate layer comprises Ge nanocrystalls in a silicon oxide matrix; and said precursor layer is converted to said conglomerate layer by a high-pressure oxidation followed by a reduction in hydrogen.

18. The method of claim 12, wherein:

said precursor layer comprises germosilicate glass formed by atmospheric pressure chemical vapor deposition;

said conglomerate layer comprises Ge nanocrystalls in a silicon oxide matrix; and said precursor layer is converted to said conglomerate layer by annealing in hydrogen.

19. The method of claim 12, wherein said precursor layer is between 10 and 100 Å . . . thick.

20. The method of claim 12, wherein said particulates are removed simultaneously with the etching of said pits.

21. The method of claim 12, wherein said particulates are between 10 and 100 Å . . . in size.

22. The method of claim 16, wherein said Ge nanocrystalls are between 10 and 100 Å . . . in size.

23. The method of claim 12, wherein said trench conductor is selected from the group consisting of polysilicon, doped polysilicon, tungsten, tungsten nitride and titanium nitride.

24. The method of claim 13, further including the step of removing said islands before forming said node insulator.

* * * * *